(12) United States Patent
Lee et al.

(10) Patent No.: US 10,950,749 B2
(45) Date of Patent: Mar. 16, 2021

(54) LIGHT EMISSION DEVICE INCLUDING OUTPUT COUPLER AND OPTICAL APPARATUS ADOPTING THE SAME

(71) Applicants: SAMSUNG ELECTRONICS CO., LTD., Suwon-si (KR); CALIFORNIA INSTITUTE OF TECHNOLOGY, Pasadena, CA (US)

(72) Inventors: Duhyun Lee, Yongin-si (KR); Ruzan Sokhoyan, Pasadena, CA (US); Yu-Jung Lu, Pasadena, CA (US); Ghazaleh Kafaie Shirmanesh, Pasadena, CA (US); Harry A. Atwater, Pasadena, CA (US); Ragip A. Pala, Pasadena, CA (US); Chan-Wook Baik, Yongin-si (KR)

(73) Assignees: SAMSUNG ELECTRONICS CO., LTD., Suwon-si (KR); CALIFORNIA INSTITUTE OF TECHNOLOGY, Pasadena, CA (US)

(*) Notice: Subject to any disclaimer, the term of this patent is extended or adjusted under 35 U.S.C. 154(b) by 0 days.

(21) Appl. No.: 16/175,113

(22) Filed: Oct. 30, 2018

(65) Prior Publication Data
US 2019/0131491 A1    May 2, 2019

Related U.S. Application Data

(60) Provisional application No. 62/579,244, filed on Oct. 31, 2017.

(30) Foreign Application Priority Data

Apr. 4, 2018    (KR) .................. 10-2018-0039339

(51) Int. Cl.
*H01L 33/06*    (2010.01)
*G02B 5/00*    (2006.01)
(Continued)

(52) U.S. Cl.
CPC .............. *H01L 33/06* (2013.01); *G02B 5/008* (2013.01); *G02F 1/015* (2013.01); *H01L 33/10* (2013.01);
(Continued)

(58) Field of Classification Search
CPC .......... H01L 33/06; H01L 33/60; H01L 33/10
See application file for complete search history.

(56) References Cited

U.S. PATENT DOCUMENTS 9,581,854 B2    2/2017 Ren et al.
9,632,216 B2    4/2017 Han et al.
(Continued)

FOREIGN PATENT DOCUMENTS

EP    3 182 200 A1    6/2017
JP    2014-190975 A    10/2014
(Continued)

OTHER PUBLICATIONS

Communication dated Mar. 14, 2019 issued by the European Patent Office in European counterpart Application No. 18195396.9.

*Primary Examiner* — Cuong Q Nguyen
(74) *Attorney, Agent, or Firm* — Sughrue Mion, PLLC

(57) ABSTRACT

Provided are light emission devices including an output coupler and optical apparatuses having the same. The light emission device may include a QD layer containing quantum dots and a nano-antenna structure including an output coupler configured to control an output characteristic of light emitted from the QD layer. The output coupler may be configured to output an emission wavelength of the QD layer. The nano-antenna structure may include one of a metallic antenna, a dielectric antenna, and a slit-containing structure, or may have a multi-patch antenna structure or a fishbone antenna structure.

28 Claims, 15 Drawing Sheets

(51) Int. Cl.
*G02F 1/015* (2006.01)
*H01L 33/10* (2010.01)
*H01L 33/60* (2010.01)
H01L 23/66 (2006.01)

(52) U.S. Cl.
CPC .......... *H01L 33/60* (2013.01); *G02F 2203/10* (2013.01); *H01L 23/66* (2013.01)

(56) References Cited

U.S. PATENT DOCUMENTS

| | | |
|---|---|---|
| 2003/0206741 A1 | 11/2003 | Ledentsov et al. |
| 2006/0067602 A1 | 3/2006 | Todori et al. |
| 2012/0170097 A1 | 7/2012 | Han et al. |
| 2015/0243849 A1 | 8/2015 | Stroetmann |
| 2016/0161644 A1 | 6/2016 | Verschuuren et al. |
| 2017/0031183 A1* | 2/2017 | Han ................ H01L 33/06 |
| 2017/0084761 A1 | 3/2017 | Cho et al. |
| 2018/0292681 A1 | 10/2018 | Han et al. |
| 2019/0107740 A1* | 4/2019 | Lee .................. G02F 1/017 |

FOREIGN PATENT DOCUMENTS

| | | |
|---|---|---|
| KR | 10-2016-0096527 A | 8/2016 |
| KR | 10-2017-0013147 A | 2/2017 |
| WO | 2013/068516 A1 | 5/2013 |
| WO | 2015/181034 A1 | 12/2015 |
| WO | 2016/108990 A2 | 7/2016 |

* cited by examiner

LIGHT EMISSION DEVICE INCLUDING OUTPUT COUPLER AND OPTICAL APPARATUS ADOPTING THE SAME

CROSS-REFERENCE TO RELATED APPLICATION

This application is based on and claims priority from U.S. Provisional Patent Application No. 62/579,244, filed on Oct. 31, 2017, in the USPTO, and Korean Patent Application No. 10-2018-0039339, filed on Apr. 4, 2018, in the Korean Intellectual Property Office, the disclosures of which are incorporated herein in their entirety by reference.

BACKGROUND

1. Field

The present disclosure relates to light emission devices and optical apparatuses including the same.

2. Description of the Related Art

Devices for emitting light or modulating the characteristics of light may be used in a variety of optical apparatuses. A method of generating or emitting light may include a variety of methods such as an electroluminescence (EL) method, a photoluminescence (PL) method, or a cathodeluminescence (CL) method. In terms of optical modulation, a variety of modulation methods for changing transmission/reflection characteristics, phase, amplitude, polarization, intensity, path, etc. of light have been suggested. For example, liquid crystal having optical anisotropy or a microelectromechanical system (MEMS) structure have general optical modulators that use a fine mechanical movement of a light blocking/reflection element for performing optical modulation. Such optical modulators have a slow operation response time of over several microseconds (µs) due to the characteristics of a driving method.

SUMMARY

Provided are light emission and optical modulating devices using quantum dots (QDs).

Provided are nano-antenna structures including output couplers which may improve the output characteristics of light in light emission and optical modulating devices using QDs.

Provided are light emission devices which may control (modulate) optical characteristics at high speed.

Provided are optical apparatuses including the light emission and optical modulating devices.

Additional aspects will be set forth in part in the description which follows and, in part, will be apparent from the description, or may be learned by practice of the presented embodiments.

According to an aspect of the disclosure, there is provided a quantum dot (QD) light emission device comprising: a layered structure comprising a QD layer, the QD layer comprising a plurality of QDs having light emission characteristics; and a nano-antenna structure comprising an output coupler configured to control an output characteristic of light emitted from the QD layer.

The output coupler maybe further configured to output an emission wavelength of the QD layer.

A resonance wavelength region of the output coupler maybe at least partially overlapped with an emission wavelength region of the QD layer.

The output coupler may comprise one of a metallic antenna, a dielectric antenna, and a slit-containing structure.

The output coupler may comprise a refractive index change material or a phase change material, and the output characteristic of light maybe controlled based on a refractive index change or a phase change of the output coupler.

The nano-antenna structure may further comprise an input coupler spaced apart from the output coupler.

A resonance wavelength region of the input coupler maybe at least partially overlapped with an excitation wavelength region of the plurality of QDs.

The nano-antenna structure may have a multi-patch antenna structure or a fishbone antenna structure.

Input light to the light emission device may have a first polarized direction, and output light from the light emission device may have a second polarized direction perpendicular to the first polarized direction.

The output coupler may comprise a plurality of output couplers, and a first output coupler, among the plurality of output couplers, may have a size different from a second output coupler, among the plurality of output couplers.

The layered structure ma further comprise a refractive index change layer provided adjacent to the QD layer, and a light emission characteristic of the QD layer maybe modulated based on a change in a refractive index of the refractive index change layer.

The layered structure may have a stack structure comprising: a plurality of QD layers and a plurality of refractive index change layers, and the plurality of QD layers maybe arranged between the plurality of refractive index change layers.

At least two of the plurality of QD layers may have different central emission wavelengths.

At least two of the plurality of refractive index change layers maybe made of different materials or may have different carrier densities.

The QD light emission device may further comprise one of a light source element configured to optically excite QDs of the plurality of QD layers and an optical waveguide configured to guide light to optically excite the QDs of the plurality of QD layers.

The QD light emission device may further comprise: a reflector provided at a first surface of the stack structure; and a band-stop mirror provided at a second surface of the stack structure.

The QD light emission device may further comprise one of a light source element configured to optically excite QDs of the plurality of QD layers or an optical waveguide configured to guide light to optically excite the QDs, and the one of the light source element and the optical waveguide maybe provided between the stack structure and the reflector.

The layered structure may further comprise a reflector and a refractive index change layer, the refractive index change layer maybe arranged between the reflector and the QD layer, and the QD layer maybe arranged between the refractive index change layer and the nano-antenna structure.

The QD light emission device may further comprise a first dielectric layer arranged between the reflector and the refractive index change layer; and a second dielectric layer arranged between the refractive index change layer and the QD layer.

According to another aspect of the disclosure, there is provided an optical apparatus comprising the QD light emission device.

According to another aspect of the disclosure, there is provided a quantum dot (QD) light emission device comprising: a multilayer structure comprising a QD layer and a refractive index change layer adjacent to the QD layer, the QD layer comprising a plurality of QDs having light emission characteristics; and an output coupler arranged on a surface of the multilayer structure and configured to control an output characteristic of light emitted from the QD layer, wherein the light emission characteristic of the QD layer is modulated based on a change in a refractive index of the refractive index change layer, and wherein the output coupler is further configured to output at an emission wavelength of the QD layer.

The output coupler may comprise one of a metallic antenna, a dielectric antenna, and a slit-containing structure.

The QD light emission device may further comprise an input coupler provided on the surface of the multilayer structure and spaced apart from the output coupler.

The output coupler and the input coupler may have a multi-patch antenna structure or a fishbone antenna structure.

The multilayer structure may comprise: a plurality of QD layers and a plurality of refractive index change layers, wherein the plurality of QD layers are arranged between the plurality of refractive index change layers, and wherein at least two of the plurality of QD layers have different central emission wavelengths, or at least two of the plurality of refractive index change layers are made of different materials or have different carrier densities.

The multilayer structure may further comprises a reflector, and the refractive index change layer maybe arranged between the reflector and the QD layer, and the QD layer maybe arranged between the refractive index change layer and the output coupler.

The QD light emission device may further comprise: a first dielectric layer arranged between the reflector and the refractive index change layer; and a second dielectric layer arranged between the refractive index change layer and the QD layer.

According to another aspect of the disclosure, there is provided a Quantum Dot (QD) light emission device comprising: a light provisioning layer configured to provide incident light; a first refractive index change layer provided on the light provisioning layer; a QD layer provided on the first refractive index change layer, the QD layer comprising a plurality of QDs which emit light based on the incident light; a second refractive index change layer provided on the QD layer; and an output coupler provided on the second refractive index change layer and configured to control a light emission characteristic of the light emitted from the QD layer.

The output coupler maybe further configured to output at an emission wavelength of the QD layer.

The light emission characteristic of the light emitted from the QD layer maybe modulated based on a change in a refractive index of the refractive index change layer.

The light provisioning layer maybe one of a light source or an optical waveguide.

The QD light emission device may further comprise: a reflector provided on a side of the light provisioning layer opposite another side on which the first refractive index change layer is provided; and a band-stop mirror is provided between the output coupler and the second refractive index change layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
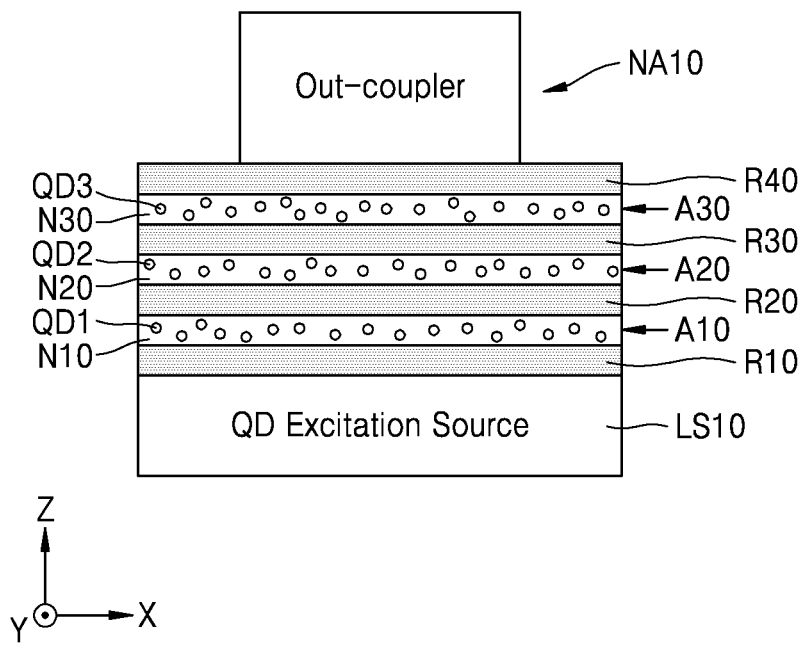
FIG. 1 is a cross-sectional view of a quantum dot (QD) light emission device according to an embodiment.

Various embodiments will now be described more fully with reference to the accompanying drawings in which embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to like elements throughout. Also, the size of each layer illustrated in the drawings may be exaggerated for convenience of explanation and clarity. In this regard, the present embodiments may have different forms and should not be construed as being limited to the descriptions set forth herein.

FIG. 1 is a cross-sectional view of a quantum dot (QD) light emission device according to an embodiment.

Referring to FIG. 1, a layered structure may include a QD layer having a plurality of QDs having light emission characteristics, for example, first, second and third QD layers A10, A20, and A30. A nano-antenna structure NA10 having an output coupler that is configured to control the output characteristics of light emitted from the first, second and third QD layers A10, A20, and A30.

The first, second and third QD layers A10, A20, and A30 having QDs may be arranged to be spaced apart from each other. For example, first, second and third QD layers A10, A20, and A30 may be provided with a non-QD layer in between. However, the number of QD-containing layers is exemplary and may be changed. The first, second and third QD-containing layers A10, A20, and A30 may respectively include first, second and third insulating layers N10, N20, and N30 and a plurality of quantum dots QD1, QD2, and QD3 respectively embedded in the first, second and third insulating layers N10, N20, and N30. The quantum dots QD1 included in the first QD layer A10 may be referred to as first QDs, the quantum dots QD2 included in the second QD layer A20 may be referred to as second QDs, and the quantum dots QD3 included in the third QD layer A30 may be referred to as third QDs. At least two of the first, second and third QD layers A10, A20, and A30 may have different central emission wavelengths. In this regard, at least two of the first, second and third quantum dots QD1, QD2, and QD3 may include different materials and/or have different sizes. The central emission wavelengths of the first, second and third QD layers A10, A20, and A30 may vary according to the material or size of the QDs. All of the first, second and third quantum dots QD1, QD2, and QD3 may have different central emission wavelengths. However, in some cases, at least two of the first, second and third quantum dots QD1, QD2, and QD3 may have the same central emission wavelength. In this case, the at least two of the first to third quantum dots QD1, QD2, and QD3 may be substantially the same.

A plurality of refractive index change layers may be provided spaced apart from each other. For example, first, second, third and fourth refractive index change layers R10, R20, R30, and R40 may be provided, and the first, second and third QD layers A10, A20, and A30 may be arranged between the first, second, third and fourth refractive index change layers R10, R20, R30, and R40. The first, second, third and fourth refractive index change layers R10, R20, R30, and R40 each may be a layer having a refractive index that is changed according to an electrical signal applied thereto or other condition changes. The first, second, third and fourth refractive index change layers R10, R20, R30, and R40 may be layers in which permittivity is changed according to an electrical condition. A charge concentration (charge density) of an area or areas in the first, second, third and fourth refractive index change layers R10, R20, R30, and R40 may be changed according to an electric field applied to the first, second, third and fourth refractive index change layers R10, R20, R30, and R40. Accordingly, the permittivity of the first, second, third and fourth refractive index change layers R10, R20, R30, and R40 may be changed. For example, each of the first, second, third and fourth refractive index change layers R10, R20, R30, and R40 may include a transparent conductive oxide (TCO) such as indium tin oxide (ITO), indium zinc oxide (IZO), aluminium zinc oxide (AZO), gallium zinc oxide (GZO), aluminium gallium zinc oxide (AGZO), or gallium indium zinc oxide (GIZO), or a transition metal nitride such as TiN, ZrN, HfN, or TaN. In addition, the first, second, third and fourth refractive index change layers R10, R20, R30, and R40 may include an electro-optic (EO) material whose effective permittivity is changed when an electrical signal is applied thereto. The electro-optic material may include, for example, a crystal material such as $LiNbO_3$, $LiTaO_3$, potassium tantalate niobate (KTN), or lead zirconate titanate (PZT), or various polymers having electro-optic characteristics. The first, second, third and fourth refractive index change layers R10, R20, R30, and R40 may be a semiconductor, a conductor, or a dielectric. The first, second, third and fourth refractive index change layers R10, R20, R30, and R40 may be transparent or substantially transparent.

The first, second, third and fourth refractive index change layers R10, R20, R30, and R40 may be formed of the same material, and may have the same carrier density. By varying an electrical signal applied to the first, second, third and fourth refractive index change layers R10, R20, R30, and R40, or other conditions, the characteristics of the first, second, third and fourth refractive index change layers R10, R20, R30, and R40 may be independently controlled. In some embodiments, at least two of the first, second, third and fourth refractive index change layers R10, R20, R30, and R40 may include different materials and/or may have different carrier densities. In this case, controlling the characteristics of the first, second and third QD layers A10, A20, and A30 to be different from one another may be made easy by using the first, second, third and fourth refractive index change layers R10, R20, R30, and R40.

The light emission device according to the present embodiment may be configured to modulate the light-emission characteristics of the first, second and third QD layers A10, A20, and A30 by using a change in the refractive indexes of the first, second, third and fourth refractive index change layers R10, R20, R30, and R40. When the first, second and third QD layers A10, A20, and A30 have different central emission wavelengths, the light emission device may have the characteristics of emitting light (light beams) of a multi-wavelength region. In this state, the light beams of a multi-wavelength region may be independently controlled. Accordingly, a light emission device capable of emitting light beams of a multi-wavelength region and capable of easily controlling (modulating) the light beams is provided according to an embodiment of the present disclosure p. A light emission device capable of multiplexing the light beams of multiple wavelength regions (a plurality of wavelength regions) may be provided. A multiplexing light emission device capable of actively tuning a light beam for each wavelength region may be provided.

The light emission device may further include a light source element LS10 for optically exciting the first, second and third quantum dots QD1, QD2, and QD3 of the first, second and third QD layers A10, A20, and A30. The light source element LS10 may be provided under the first refractive index change layer R10. The light source element LS10 may include an inorganic-based light-emitting device (iLED), an organic light-emitting device (OLED), or a laser diode (LD). Light to excite the first, second and third quantum dots QD1, QD2, and QD3, that is, excitation light, may be irradiated from the light source element LS10 toward the first, second and third QD layers A10, A20, and A30.

The QDs applied to the present embodiment, that is, the first, second and third quantum dots QD1, QD2, and QD3, may mean semiconductor particles having a ball shape of a nanometer size or a shape similar thereto, and may have a size (diameter) of about several nanometers (nm) to about several tens of nanometers. A QD may have a monolithic structure or a core-shell structure. The core-shell structure may have a single shell or a multi-shell. For instance, the core-shell structure may include a core part (central body) formed of a certain first semiconductor and a shell part formed of a second semiconductor. The QD may include at least one of II-VI group based semiconductor, III-V group based semiconductor, IV-VI group based semiconductor, and IV group based semiconductor. Since the QD has a very small size, a quantum confinement effect may be obtained. When particles are very small, electrons in the particle have a discontinuous energy state by an outer wall of the particle. In this case, as the size of a space in the particle decreases, the energy state of the electrons relatively increases and an energy band gap increases, which is referred to as the quantum confinement effect. According to the quantum confinement effect, when light such as an infrared ray or a visible ray is incident on QDs, light having a wavelength of various ranges may be generated. The wavelength of light generated from a QD may be determined based on the size, material, or structure of a particle (QD). In detail, when light of a wavelength having energy greater than the energy band gap is incident on a QD, the QD may absorb energy of the light and be excited, and may return to the ground state by emitting light of a specific wavelength. In this case, as the size of a QD (or the core part of the QD) decreases, light of a relatively short wavelength, for example, a blue-based light or a green-based light may be generated. As the size of a QD (or the core part of the QD) increases, light of a relatively long wavelength, for example, a red-based light may be generated. Accordingly, light of various colors may be generated depending on the size of a QD (or the core part of the QD). The emission wavelength may be adjusted not only by the size (diameter) of a QD, but also by the constituent material and structure thereof. The first, second and third insulating layers N10, N20, and N30 in which the first, second and third quantum dots QD1, QD2, and QD3 are embedded may be dielectric layers, for example, a silicon oxide or a silicon nitride. Each of the first, second and third QD layers A10, A20, and A30 may have a thickness of, for example, about several tens of nanometers or less. Each of the first, second, third and fourth refractive index change layers R10, R20, R30, and R40 may have a thickness of, for example, about several tens of nanometers or less. However, the thicknesses of the first, second and third QD layers A10, A20, and A30 and the first, second, third and fourth refractive index change layers R10, R20, R30, and R40 are not limited thereto and may vary.

According to an embodiment, by using a change in the characteristics of the first, second, third and fourth refractive index change layers R10, R20, R30, and R40, the light-emission characteristics of the first, second and third QD layers A10, A20, and A30 may be quickly and easily modulated. In particular, the characteristics of the first, second, third and fourth refractive index change layers R10, R20, R30, and R40 may be easily by using a changed electrical signal, and consequently fast optical modulation may be possible. Furthermore, by using the first, second and third QD layers A10, A20, and A30 having different central emission wavelengths, light of multiple wavelength regions (that is, multi-color) may be multiplexed, and may be quickly modulated. Light beams of different wavelength regions may be independently controlled (modulated). When the first, second and third QD layers A10, A20, and A30 all include the same quantum dots, as a device is formed by inserting the first, second and third QD layers A10, A20, and A30 between the first, second, third and fourth refractive index change layers R10, R20, R30, and R40, luminous efficiency and modulation efficiency may be improved.

A stack structure of the first, second, third and fourth refractive index change layers R10, R20, R30, and R40 and the first, second and third QD layers A10, A20, and A30 may be provided on the light source element LS10, and a nano-antenna structure NA10 may be provided on the stack structure. The nano-antenna structure NA10 may be an output coupler that improves the output characteristics of light from the first, second and third QD layers A10, A20, and A30. The nano-antenna structure NA10 may have a configuration coupled to an emission wavelength of at least one of the first, second and third QD layers A10, A20, and A30. For example, a resonance wavelength region of the nano-antenna structure NA10 may be at least partially overlapped with an emission wavelength region of the first, second and third QD layers A10, A20, and A30. The light-emission/output characteristics in the first, second and third QD layers A10, A20, and A30 may be improved by the nano-antenna structure NA10, and the directivity and directionality of output light may be improved. Accordingly, far-field emission characteristics may be embodied by using the nano-antenna structure NA10.

The nano-antenna structure NA10 may include any one of various structures such as a metallic antenna, a dielectric antenna, or a slit-containing structure, for example, a structure in which a slit is formed in a metal layer. The output characteristics of light may vary according to the size, shape, or material of the nano-antenna structure NA10. Furthermore, the nano-antenna structure NA10 may include a refractive index change material or a phase change material. In this case, the output characteristics of light may be controlled by using the nano-antenna structure NA10, that is, a refractive index change or phase change of the output coupler. The phase change material may include a Ge—Sb—Te based chalcogenide material or a vanadium (V) oxide. When the output characteristics of light are controlled by using the characteristics change of the nano-antenna structure NA10, the nano-antenna structure NA10 may be a tunable output coupler.

Figure 2:
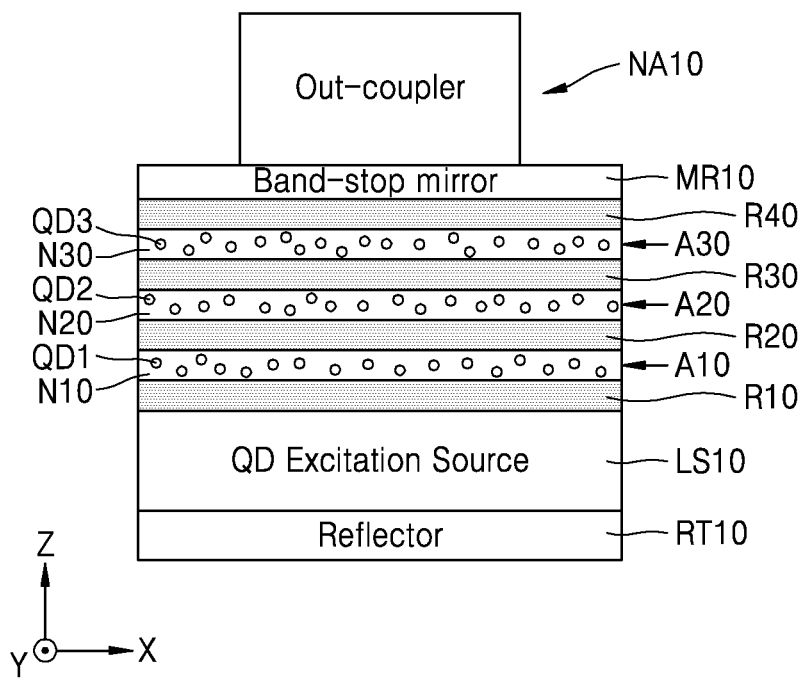
FIG. 2 is a cross-sectional view of a QD light emission device according to another embodiment.

FIG. 2 is a cross-sectional view of a QD light emission device according to another embodiment;

Referring to FIG. 2, when the refractive index change layers R10, R20, R30, and R40 and the QD layers A10, A20, and A30 constitute one stack structure, the light emission device may further include a reflector RT10 provided at a surface of the stack structure and a band-stop mirror MR10 provided at an opposite surface of the stack structure. For instance, according to an embodiment, the reflector RT10 may be provided on a top surface of the stack structure and a band-stop mirror MR10 provided below a bottom surface of the stack structure. In this state, a light source element LS10 may be disposed between the stack structure and the reflector RT10. The band-stop mirror MR10 may be disposed between the stack structure and the nano-antenna structure NA10.

The band-stop mirror MR10 may have reflection characteristics to the light of a particular wavelength region (band) and transmission characteristics to the other wavelength regions. The band-stop mirror MR10 may have, for example, a distributed Bragg reflector (DBR) structure. Two dielectric layers having different refractive indexes may be repeatedly stacked under a $\lambda/4$ thickness condition, where $\lambda$ is a wavelength of light, and thus reflectivity or transmissivity in a desired wavelength region may be increased. However, the band-stop mirror MR10 may have a structure other than the DBR structure. The reflector RT10 may be formed of a conductor such as metal or may have a DBR structure. The reflector RT10 may be a back reflector electrode. Light to excite, that is, excitation light, the first, second and third quantum dots QD1, QD2, and QD3 may be irradiated from the light source element LS10 to the QD layers A10, A20, and A30. The reflector RT10 and the band-stop mirror MR10 may configure a cavity structure such that the above-described excitation light is internally reflected in the optical modulating device. Accordingly, the light source element LS10, the reflector RT10, and the band-stop mirror MR10 may increase luminous efficacy and modulation efficiency of the optical modulating device. The light emitted and modulated in the first, second and third QD layers A10, A20, and A30 may be output (emitted) above the band-stop mirror MR10 by passing through the same.

Figure 3:
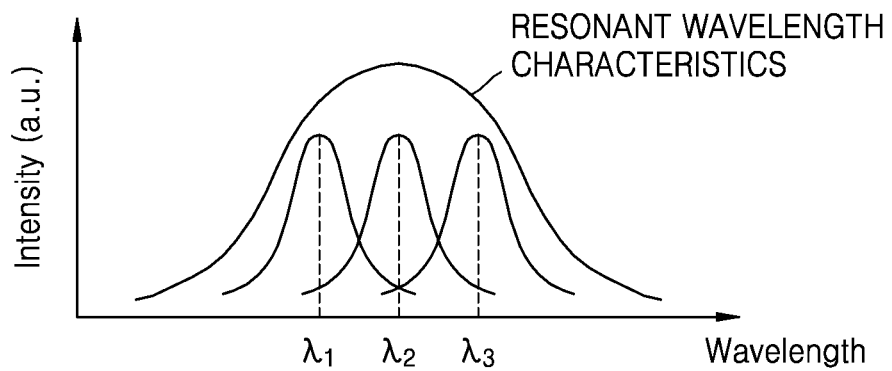
FIG. 3 is a graph exemplarily showing a relationship between the central emission wavelengths of a plurality of QDs and a resonance wavelength region of an output coupler (nano antenna), which is applicable to a QD light emission device according to an embodiment.

FIG. 3 is a graph showing a relationship between the central emission wavelengths of a plurality of QDs and a resonance wavelength region of an output coupler (nano-antenna), which is applicable to a QD light emission device according to an embodiment;

Referring to FIG. 3, the resonance wavelength region of an output coupler may cover regions of the central emission wavelengths $\lambda_1$, $\lambda_2$, and $\lambda_3$ of a plurality of QDs. Accordingly, the light-emission coupling characteristics in a plurality of QDs may be improved by the output coupler.

Figure 4:
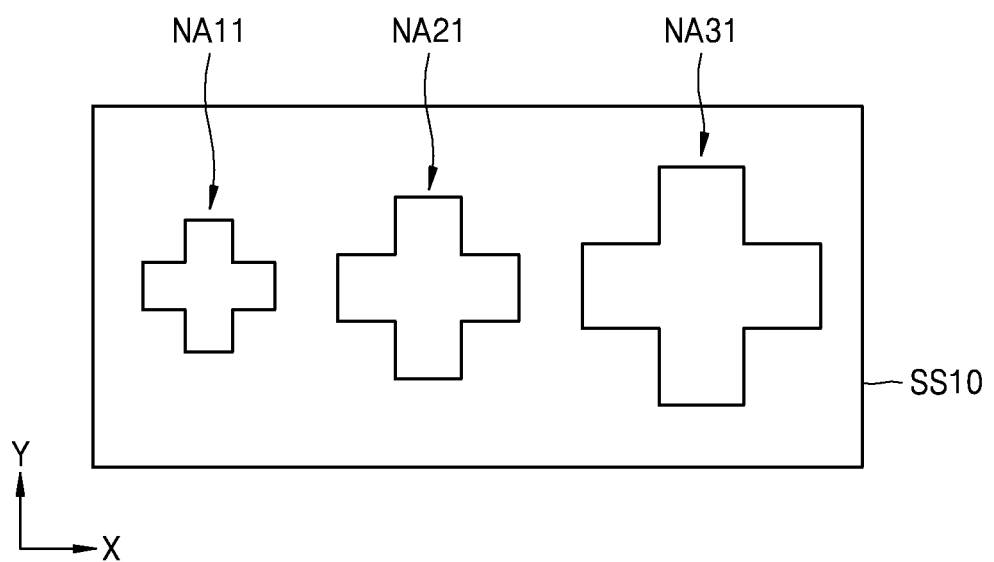
FIG. 4 is a plan view illustrating a nano-antenna structure, which is applicable to a QD light emission device according to another embodiment.

FIG. 4 is a plan view for explaining a nano-antenna structure, which is applicable to a QD light emission device according to another embodiment.

Referring to FIG. 4, a stack structure SS10 of a plurality of refractive index change layers and a plurality of QD layers may include a plurality of nano-antennas. The nano-antennas may include, for example, a first nano-antenna NA11, a second nano-antenna NA21, and a third nano-antenna NA31. At least two of the first, second, and third nano-antennas NA11, NA21, and NA31 may have different sizes, may include different materials, or may have different shapes. In the present embodiment, the first, second, and third nano-antennas NA11, NA21, and NA31 are illustrated to have different sizes. The first nano-antenna NA11 may have a first resonance wavelength region corresponding to the emission wavelength of the first quantum dots QD1, the second nano-antenna NA21 may have a second resonance wavelength region corresponding to the emission wavelength of the second quantum dots QD2, and the third nano-antenna NA31 may have a third resonance wavelength region corresponding to the emission wavelength of the third quantum dots QD3. In this case, light of different wavelengths may be output from the first, second, and third nano-antennas NA11, NA21, and NA31.

Figure 5:
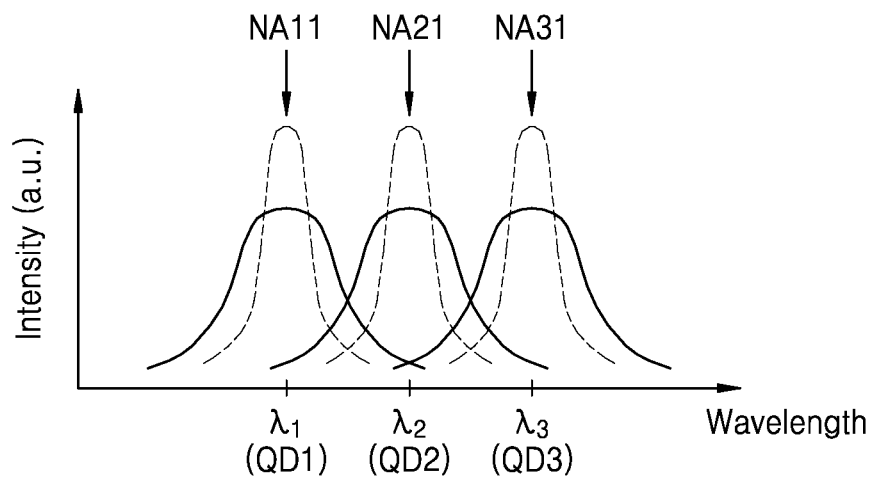
FIG. 5 is a graph exemplarily showing a relationship between the central emission wavelengths of a plurality of QDs and resonance wavelength regions of a plurality of output couplers (nano antennas), which is applicable to a QD light emission device according to another embodiment.

FIG. 5 is a graph showing a relationship between the central emission wavelengths of a plurality of QDs and resonance wavelength regions of a plurality of output couplers (nano antennas), which is applicable to a QD light emission device according to another embodiment.

Referring to FIG. 5, a resonance wavelength region of the first output coupler NA11 may correspond to the central emission wavelength $\lambda_1$ of the first quantum dots QD1, a resonance wavelength region of the second output coupler NA21 may correspond to the central emission wavelength $\lambda_2$ of the second quantum dots QD2, and a resonance wavelength region of the third output coupler NA31 may correspond to the central emission wavelength $\lambda_3$ of the third quantum dots QD3. Accordingly, the light-emission coupling characteristics in each of the QDs may be improved by each output coupler.

Figure 6:
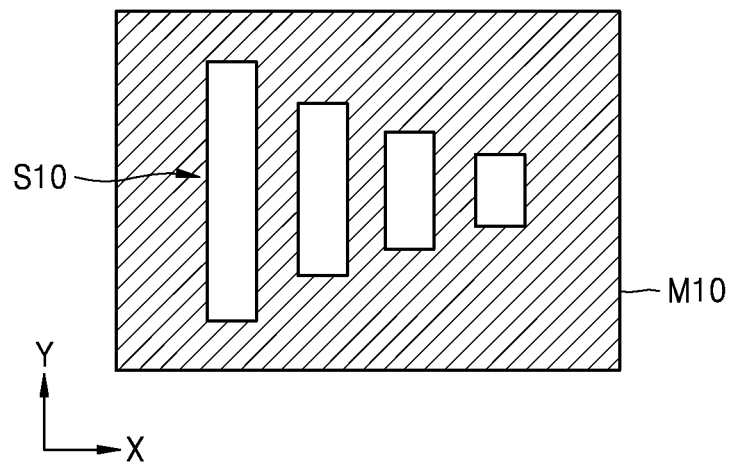
FIG. 6 is a plan view illustrating a nano-antenna structure, which is applicable to a QD light emission device according to another embodiment.

FIG. 6 is a plan view for explaining a nano-antenna structure, which is applicable to a QD light emission device according to another embodiment. The present embodiment relates to an example of a case in which a nano-antenna structure includes a slit.

Referring to FIG. 6, a slit may be formed in a material layer M10. For example, a plurality of slits S10 may be arranged forming an array. The characteristics and direction of output light may be controlled according to the size and arrangement manner of the slits S10. However, the arrangement manner of the slit S10 proposed herein is merely exemplary, and may be changed in various ways. The material layer M10 may be a metal layer.

Figure 7:
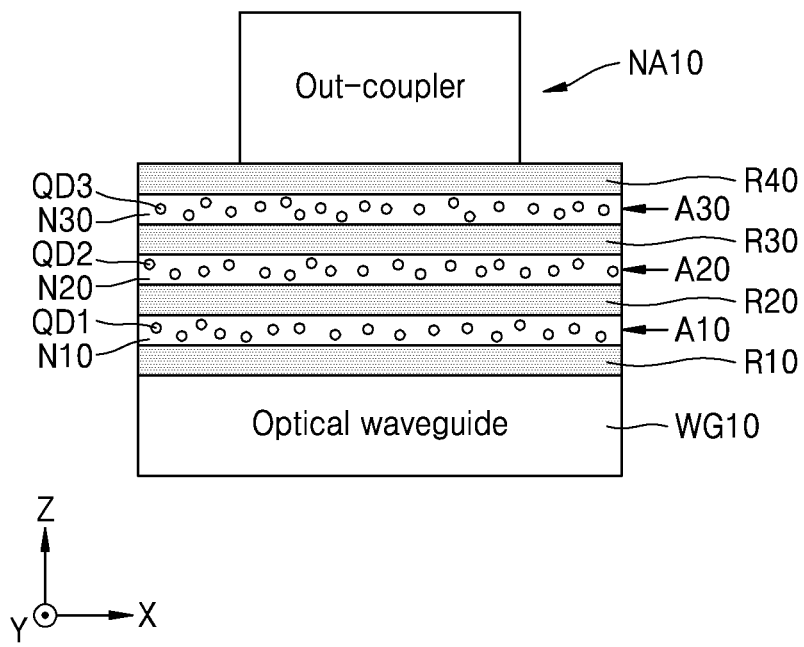
FIG. 7 is a cross-sectional view of a QD light emission device according to another embodiment.
Figure 8:
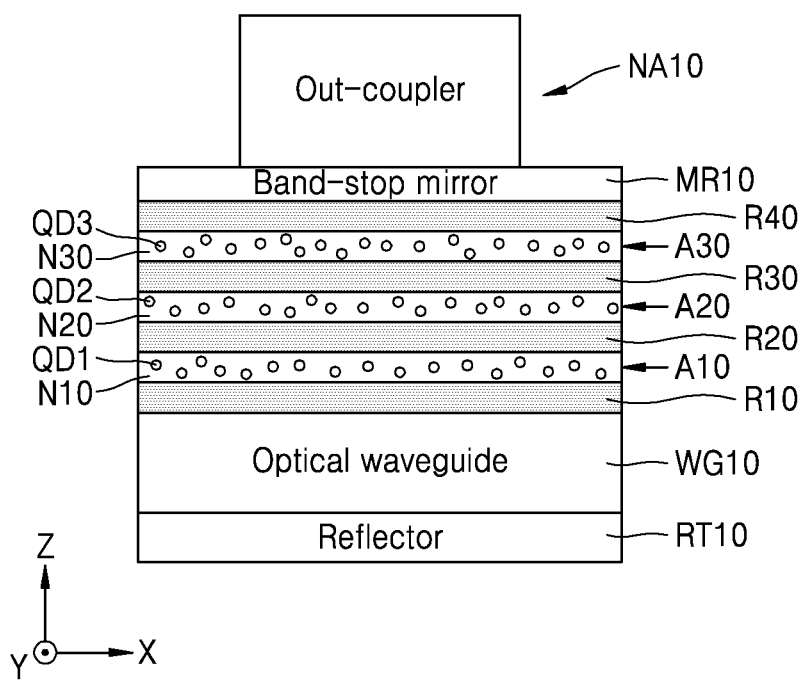
FIG. 8 is a cross-sectional view of a QD light emission device according to another embodiment.

According to another embodiment as illustrated in FIGS. 7 and 8, an optical waveguide may be provided instead of the light source element L510 shown in FIGS. 1 and 2.

FIGS. 7 and 8 respectively illustrate that an optical waveguide WG10 is provided at a position of the light source element L510 of FIGS. 1 and 2. The optical waveguide WG10 guides light to optically excite the first, second and third quantum dots QD1, QD2, and QD3. In this case, a separate light source element (not shown) optically connected to the optical waveguide WG10 may be further provided.

Figure 9:
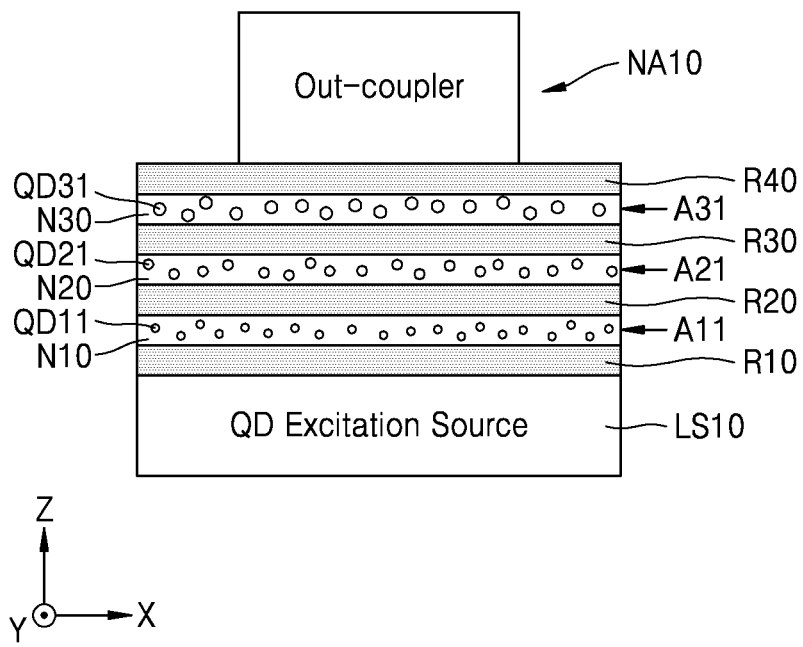
FIG. 9 is a cross-sectional view of a QD light emission device according to another embodiment.

FIG. 9 is a cross-sectional view of a QD light emission device according to another embodiment.

Referring to FIG. 9, at least two of a plurality of QD layers, for example, first, second and third QD layers A11, A21, and A31, may include QDs having different sizes. For example, first quantum dots QD11 of the first QD layer A11, second quantum dots QD21 of the second QD layer A21, and third quantum dots QD31 of the third QD layer A31 may have different sizes.

Figure 10:
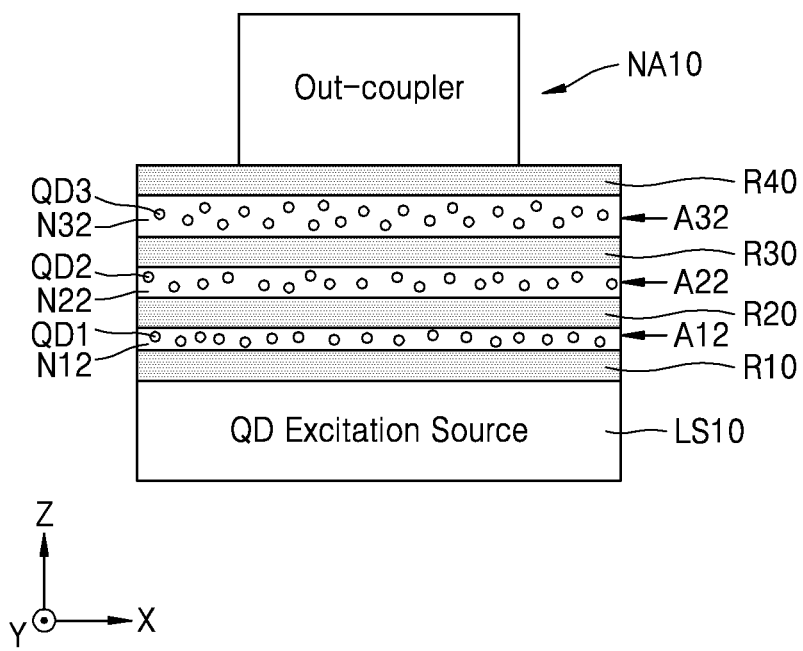
FIG. 10 is a cross-sectional view of a QD light emission device according to another embodiment

FIG. 10 is a cross-sectional view of a QD light emission device according to another embodiment.

Referring to FIG. 10, at least two of a plurality of QD layers, for example, first, second and third QD layers A12, A22, and A32 may have different thicknesses. For example, a first insulating layer N12 of the first QD layer A12, a second insulating layer N22 of the second QD layer A22, and a third insulating layer N32 of the third QD layer A32 may have different thicknesses. In this case, the amounts of first, second and third quantum dots QD1, QD2, and QD3 respectively included in the first, second and third QD layers A12, A22, and A32 may be different from one another.

Figure 11:
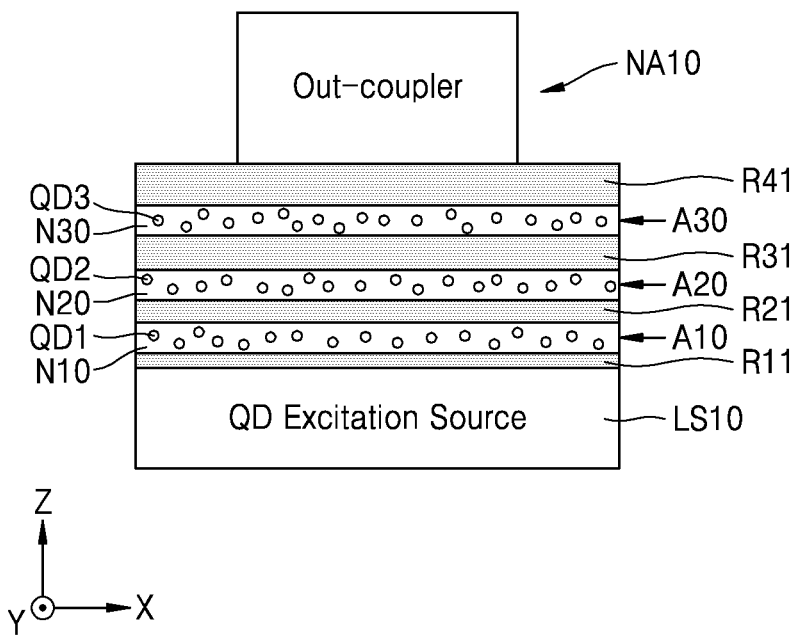
FIG. 11 is a cross-sectional view of a QD light emission device according to another embodiment

FIG. 11 is a cross-sectional view of a QD light emission device according to another embodiment.

Referring to FIG. 11, at least two of a plurality of refractive index change layers, for example, first, second, third and fourth refractive index change layers R11, R21, R31, and R41, may have different thicknesses. For example, the first, second, third and fourth refractive index change layers R11, R21, R31, and R41 may have different thicknesses. However, the changes in the sizes of the QDs and the thicknesses of the layers described with reference to FIGS. 8 to 10 are exemplary and may be variously changed, as necessary.

Figure 12:
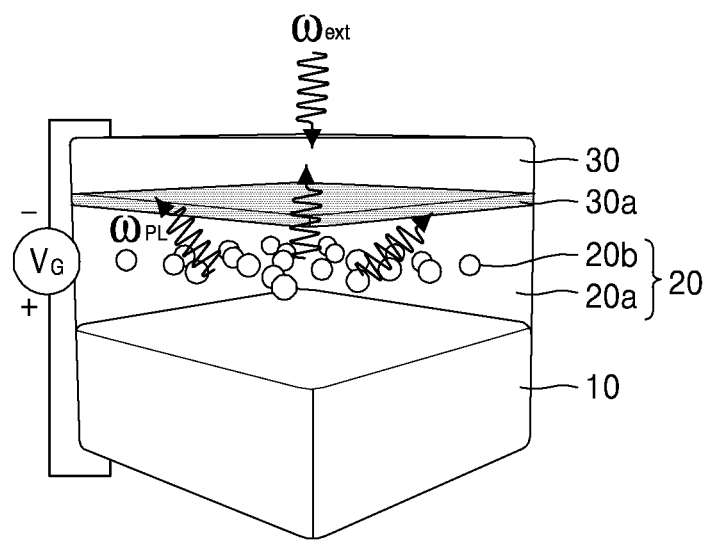
FIG. 12 is a perspective view illustrating the principle of optical modulation, which is applicable to a QD light emission device according to an embodiment.

FIG. 12 is a perspective view illustrating the principle of optical modulation, which is applicable to a QD light emission device according to an embodiment. In the following description, an optical modulating device including one QD layer is described as an example.

Referring to FIG. 12, a QD layer 20 may be disposed between a conductive layer 10 and a refractive index change layer 30. The QD layer 20 may include a plurality of QDs 20b provided in an insulating layer 20a. For example, the conductive layer 10 may include Ag, and the refractive index change layer 30 may include TiN. The insulating layer 20a may include $SiO_2$, and the QDs 20b may include InP. A signal application device $V_G$ may be connected between the conductive layer 10 and the refractive index change layer 30 to apply an electrical signal therebetween. A carrier density in a partial area (region) of the refractive index change layer 30 may be changed according to the electric signal (voltage) applied by the signal application device $V_G$ between the conductive layer 10 and the refractive index change layer 30. The area may be referred to as a carrier density change area 30a. The carrier density change area 30a may be located on a boundary surface between the refractive index change layer 30 and the QD layer 20. A local density of states (LDOS) of the refractive index change layer 30 may be changed according to a change in the carrier density. Light $\omega_{PL}$ is generated from the QDs 20b that are excited by external light $\omega_{ext}$ by a photoluminescence (PL) effect. The light-emission characteristics of QDs may be controlled (tuned) by LDOS modulation.

Figure 13:
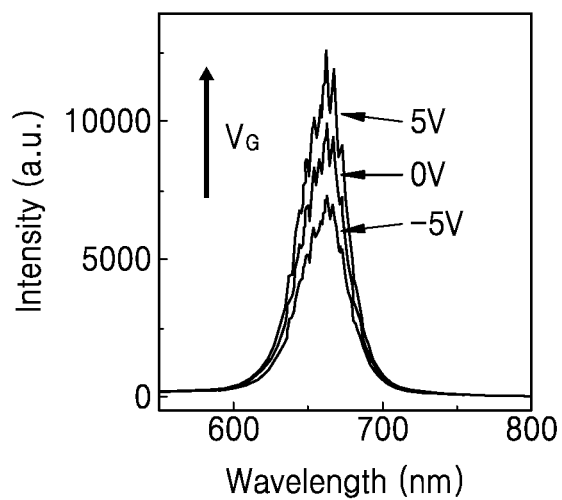
FIG. 13 is a graph showing a change in the intensity of photoluminescence (PL) according to a change in a voltage applied to the QD light emission device of FIG. 12.

FIG. 13 is a graph illustrating a change in the intensity of PL according to a change in a voltage $V_G$ applied to the QD light emission device of FIG. 12. It may be seen from the graph of FIG. 13 that the intensity of PL is changed according to the change in the voltage $V_G$.

Figure 14:
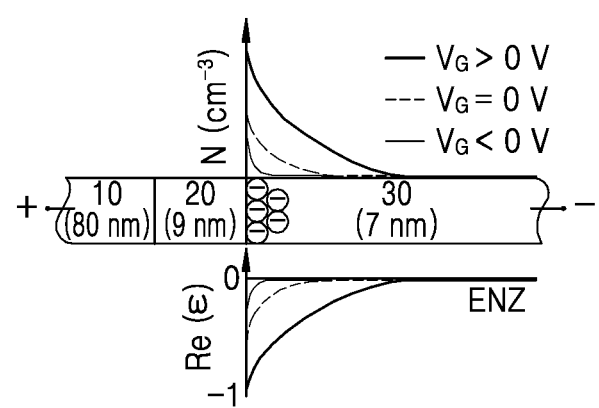
FIG. 14 is a graph showing a change in the physical properties of a refractive index change layer according to a change in the voltage applied to the QD light emission device of FIG. 12.

FIG. 14 is a graph illustrating a change in the physical properties of the refractive index change layer 30 according to a change in the voltage $V_G$ applied to the QD light emission device of FIG. 12.

Referring to FIG. 14, it may be seen how carrier density N and permittivity Re of the refractive index change layer 30 are changed according to a change in the voltage $V_G$. In particular, the physical properties of a portion of the refractive index change layer 30 adjacent to the QD layer 20 may be changed much. In the graph, "ENZ" denotes an epsilon near zero point.

Figure 15:
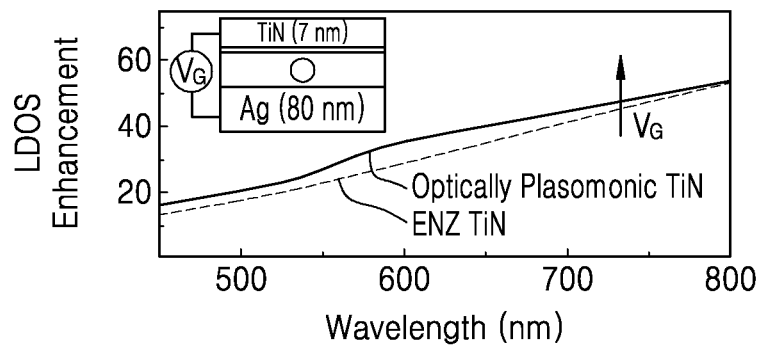
FIG. 15 is a graph showing a change of a local density of states (LDOS) enhancement spectrum at the position of QD according to a change in the voltage.

FIG. 15 is a graph showing a change of a LDOS enhancement spectrum at the position of QD according to a change in the voltage $V_G$. In the graph of FIG. 15, a dashed curve denotes that $V_G$ is less than 0 V, in which a refractive index change layer (TiN) is in an ENZ area. A solid curve denotes that $V_G$ is greater than 0 V, in which the refractive index change layer (TiN) includes an optically plasmonic TiN area. It may be seen from the graph that an LDOS enhancement effect occurs according to a change in the voltage $V_G$.

Figure 16:
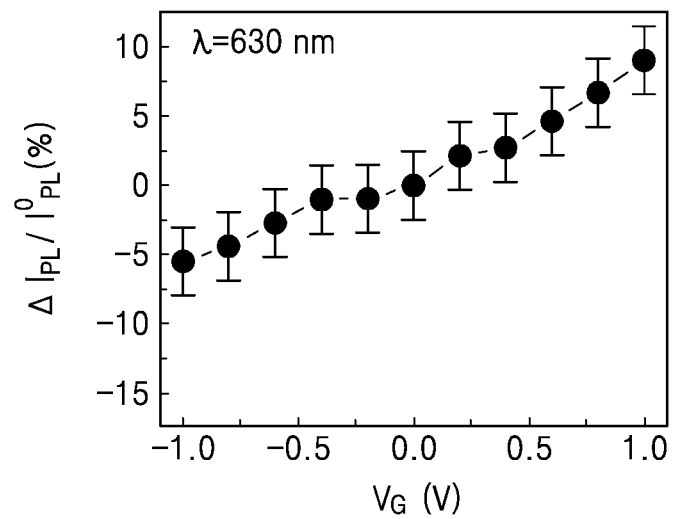
FIG. 16 is a graph showing a result of the measurement of the amount of changes in the intensity of PL of QDs according to a change in the voltage.

FIG. 16 is a graph showing a result of the measurement of the amount of changes in the intensity of PL of QDs according to a change in the voltage $V_G$. The result is obtained from the QD light emission device of FIG. 12. In the graph of FIG. 16, $I^0_{PL}$ denotes the intensity of PL at 0 V, and $\Delta I_{PL}$ denotes a difference between the intensity of PL at a certain voltage other than 0 V and the intensity of PL at 0V. It may be seen from the result of FIG. 16 that the amount of changes in the intensity of PL, that is, $\Delta I_{PL}/I^0_{PL}(\%)$, is changed according to a change in the voltage $V_G$.

Figure 17:
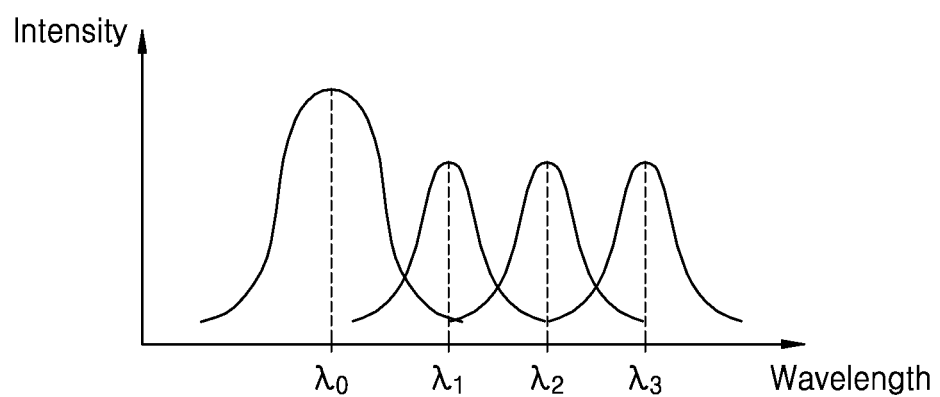
FIG. 17 is a graph showing an example of the central emission wavelengths of a plurality of QDs and emission wavelengths of a light source element, which is applicable to a QD light emission device according to an embodiment.

FIG. 17 is a graph showing an example of a central emission wavelength of a plurality of QDs and an emission wavelength of a light source element that is applicable to a QD light emission device according to an embodiment.

Referring to FIG. 17, first QDs may have a first central emission wavelength $\lambda_1$, second QDs may have a second central emission wavelength $\lambda_2$, and third QDs may have a third central emission wavelength $\lambda_3$. The first, second and third central emission wavelengths $\lambda_1$, $\lambda_2$, and $\lambda_3$ may be different from each other. The first, second and third QDs may respectively correspond to, for example, the first, second and third quantum dots QD1, QD2, and QD3 of FIG. 1. An emission wavelength $\lambda_0$ of a light source element may be less than the first, second and third central emission wavelengths $\lambda_1$, $\lambda_2$, and $\lambda_3$. The light-emission energy of a light source element may be relatively high energy. The light source element may correspond to the light source element LS10 of FIG. 1.

Figure 18:
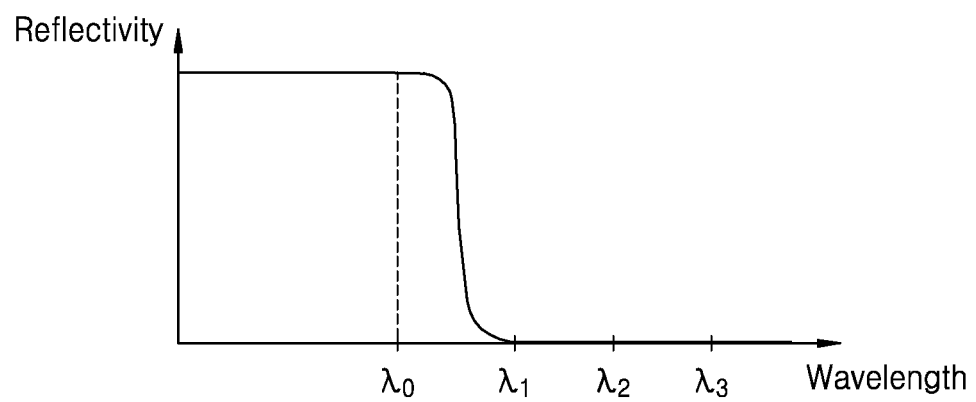
FIG. 18 is a graph showing an example of the reflection characteristics of a band-stop mirror, which is applicable to a QD light emission device according to another embodiment.

FIG. 18 is a graph showing an example of the reflection characteristics of a band-stop mirror that is applicable to a QD light emission device according to another embodiment.

Referring to FIG. 18, a band-stop mirror may have high reflectivity to the emission wavelength $\lambda_0$ of a light source element and a wavelength less than or equal to the emission wavelength $\lambda_0$, and may have low reflectivity, that is, high transmissivity, to the emission wavelengths $\lambda_1$, $\lambda_2$, and $\lambda_3$ of the QDs. The band-stop mirror may correspond to, for example, the band-stop mirror MR10 of FIG. 1.

Figure 19:
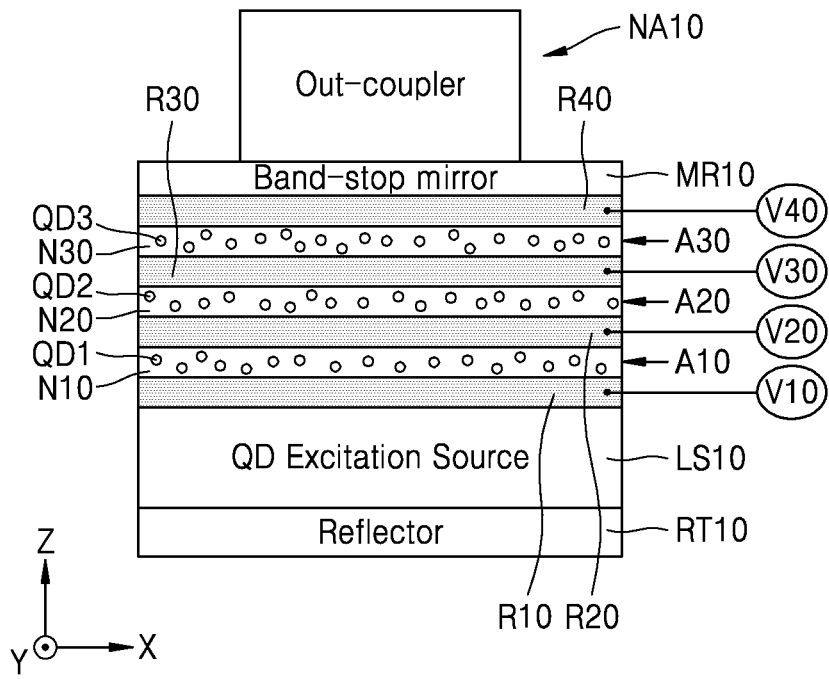
FIG. 19 is a cross-sectional view illustrating a case in which a signal application device is connected to a QD light emission device according to an embodiment.

FIG. 19 is a cross-sectional view illustrating a case in which a signal application device is connected to a QD light emission device according to an embodiment.

Referring to FIG. 19, a signal application device for applying an electrical signal to the first, second, third and fourth refractive index change layers R10, R20, R30, and R40 may be connected to the optical modulating device. For example, the signal application device may include a first voltage application device V10 for applying a voltage to the first refractive index change layer R10, the second voltage application device V20 for applying a voltage to the second refractive index change layer R20, the third voltage application device V30 for applying a voltage to the third refractive index change layer R30, and the fourth voltage application device V40 for applying a voltage to the fourth refractive index change layer R40. An electrical signal (voltage) may be independently applied to each of the first, second, third and fourth refractive index change layers R10, R20, R30, and R40. The refractive indexes of the first, second, third and fourth refractive index change layers R10, R20, R30, and R40 may be changed by using the signal application device.

Figure 20:
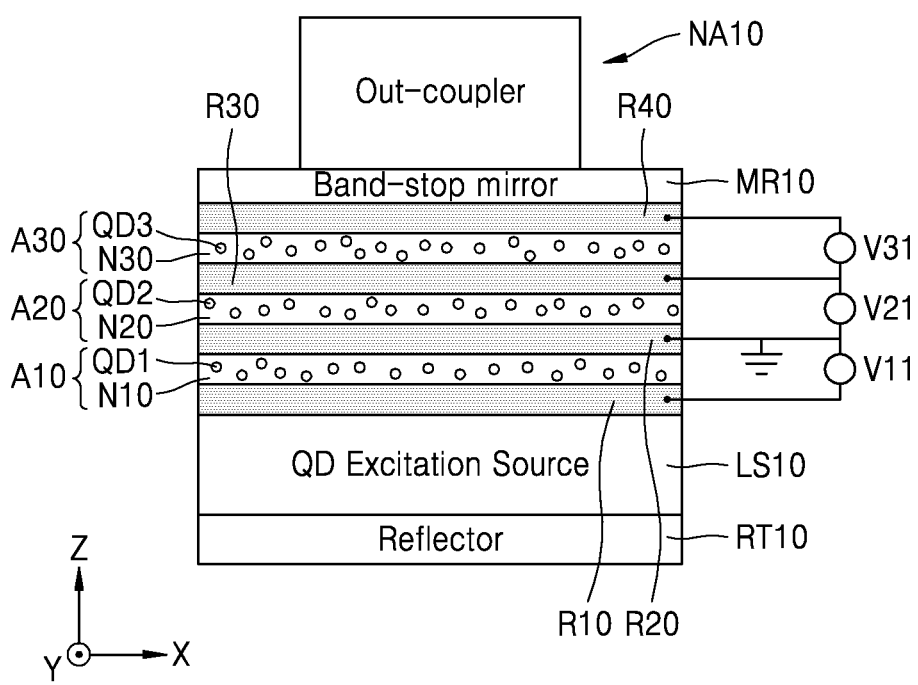
FIG. 20 is a cross-sectional view illustrating a case in which a signal application device is connected to a QD light emission device, according to another embodiment.

FIG. 20 is a cross-sectional view illustrating a case in which a signal application device is connected to a QD light emission device according to another embodiment.

Referring to FIG. 20, the signal application device may include a first voltage application device V11 for applying a voltage between the first refractive index change layer R10 and the second refractive index change layer R20, a second voltage application device V21 for applying a voltage between the second refractive index change layer R20 and the third refractive index change layer R30, and a third voltage application device V31 for applying a voltage between the third refractive index change layer R30 and the fourth refractive index change layer R40. In this case, one of the first, second, third and fourth refractive index change layers R10, R20, R30, and R40 may be grounded. Although in the present embodiment the second refractive index change layer R20 is illustrated to be grounded, this is exemplary and none of the first, second, third and fourth refractive index change layers R10, R20, R30, and R40 may be grounded as occasion arises.

Although FIGS. 19 and 20 illustrate the case in which the signal application device (signal application unit/element) for applying an electrical signal to the first, second, third and fourth refractive index change layers R10, R20, R30, and R40 is connected thereto, the connection method of the signal application device may be changed in various ways.

Figure 21:
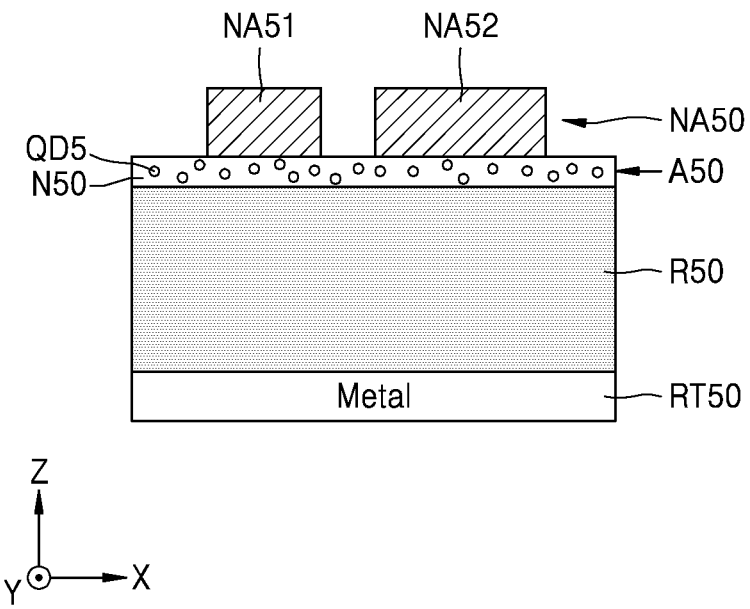
FIG. 21 is a cross-sectional view of a QD light emission device according to another embodiment.
Figure 22:
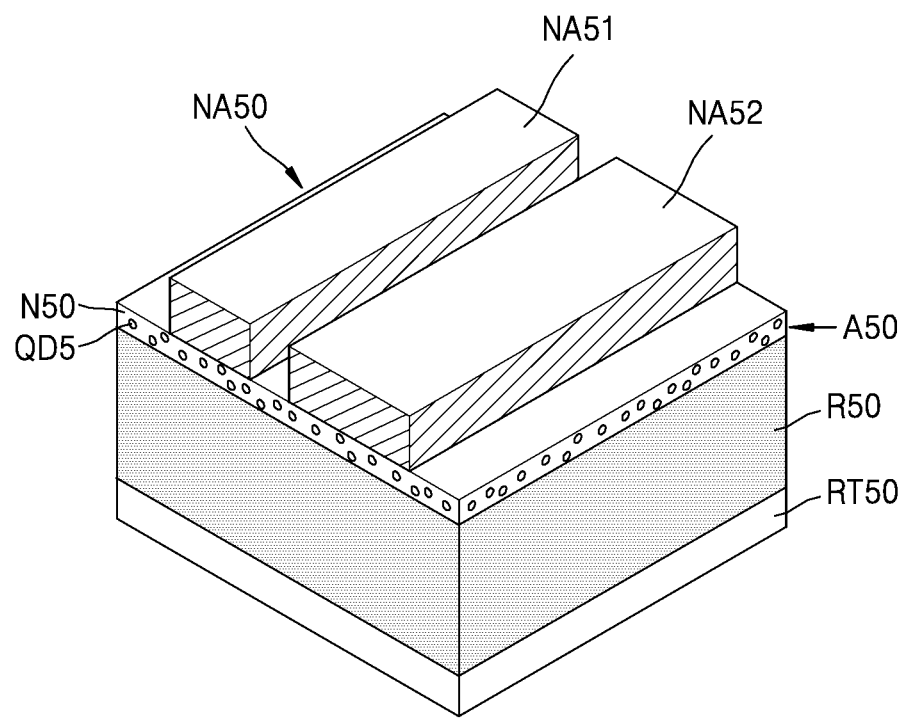
FIG. 22 is a perspective view of the QD light emission device illustrated in FIG. 21.

FIG. 21 is a cross-sectional view of a QD light emission device according to another embodiment. FIG. 22 is a perspective view of FIG. 21.

Referring to FIGS. 21 and 22, the QD light emission device may include a QD layer A50 including quantum dots QD5 and a refractive index change layer R50 provided adjacent thereto. The QD layer A50 may include the quantum dots QD5 embedded in an insulating layer N50. The QD light emission device may further include a reflector RT50 to be spaced apart from the QD layer A50. The refractive index change layer R50 may be arranged between the reflector RT50 and the QD layer A50. The light emission characteristics of the QD layer A50 may be controlled according to a change in the physical properties of the refractive index change layer R50. The refractive index change layer R50 may have a thickness related to a wavelength $\lambda$ of the light to excite the quantum dots QD5. For example, the refractive index change layer R50 may have a thickness corresponding to an integer multiple of $\lambda/4$ with respect to the wavelength $\lambda$ of the excitation light. In this case, the phase of light may be adjusted in the refractive index change layer R50, and light efficiency may be improved. However, the thickness of the refractive index change layer R50 is not limited to the above condition. The reflector RT50 may be a metal layer. The reflector RT50 may be a back reflector electrode.

The QD light emission device according to the present embodiment may include a nano-antenna structure NA50 having a dual patch structure on the QD layer A50. The nano-antenna structure NA50 may include an input coupler NA51 corresponding to a first patch and an output coupler NA52 corresponding to a second patch. A resonance wavelength region of the input coupler NA51 may be at least partially overlapped with an excitation wavelength region of the quantum dots QD5. Light coming from the outside into the QD layer A50 may be used as excitation light of the quantum dots QD5. The input coupler NA51 may increase input efficiency (input coupling efficiency) of the excitation light (incident light) that comes from the outside. In other words, the input coupler NA51 may perform an optical antenna function on the light to optically excite the quantum dots QD5. A resonance wavelength region of the output coupler NA52 may be at least partially overlapped with an emission wavelength region of the quantum dots QD5. Accordingly, light output characteristics (output coupling characteristics) in the QD layer A50 may be improved by the output coupler NA52. The width of the output coupler NA52 may be greater than the width of the input coupler NA51. A central resonance wavelength may vary according to the width of the coupler (NA51 or NA52).

Figure 23:
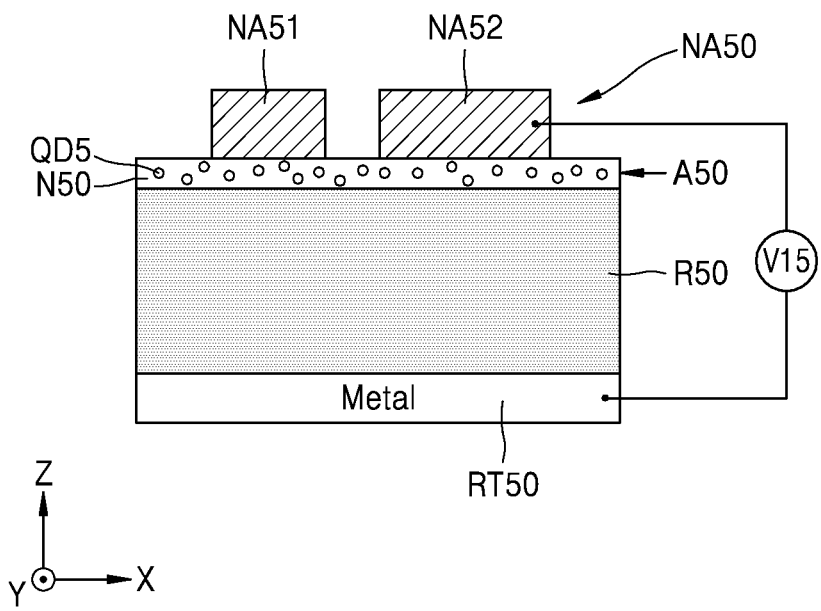
FIG. 23 is a cross-sectional view illustrating a case in which a signal application device is connected to a QD light emission device according to another embodiment.

FIG. 23 is a cross-sectional view illustrating a case in which a signal application device is connected to a QD light emission device according to another embodiment. The present embodiment shows a case in which a signal application device is connected to the QD light emission device of FIGS. 21 and 22.

Referring to FIG. 23, a signal application device for applying an electrical signal to the refractive index change layer R50 may be connected to the QD light emission device. For example, the signal application device may include a first voltage application device V15 for applying a voltage between the nano-antenna structure NA50 and the reflector RT50. The first voltage application device V15 may be connected between the output coupler NA52 and the reflector RT50. The physical properties of the refractive index change layer R50 may be changed by the voltage applied between the output coupler NA52 and the reflector RT50 by the first voltage application device V15. Accordingly, the light emission characteristics of the QD layer A50 may be controlled.

Figure 24:
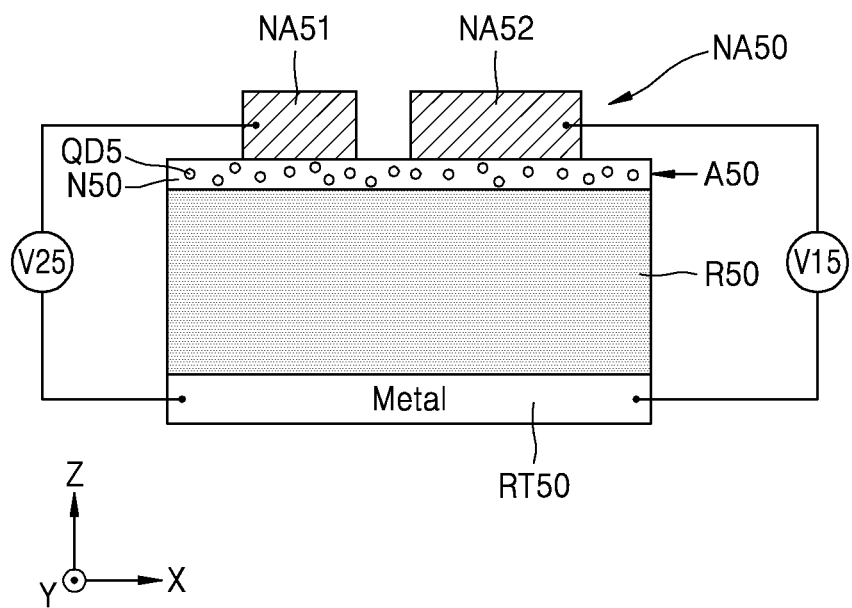
FIG. 24 is a cross-sectional view illustrating a case in which a signal application device is connected to a QD light emission device, according to another embodiment.

FIG. 24 is a cross-sectional view illustrating a case in which a signal application device is connected to a QD light emission device, according to another embodiment.

Referring to FIG. 24, the signal application device may include the first voltage application device V15 and a second voltage application device V25 for applying a voltage between the nano-antenna structure NA50 and the reflector RT50. The first voltage application device V15 may be connected between the output coupler NA52 and the reflector RT50, and the second voltage application device V25 may be connected between the input coupler NA51 and the reflector RT50. The second voltage application device V25 may control input coupling characteristics and input efficiency.

Figure 25:
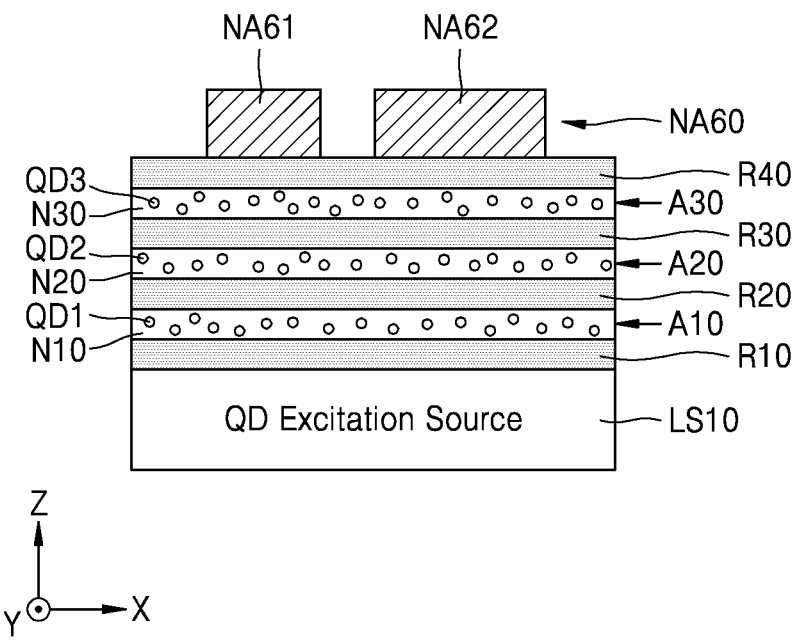
FIG. 25 is a cross-sectional view of a QD light emission device according to another embodiment.

FIG. 25 is a cross-sectional view of a QD light emission device according to another embodiment. The present embodiment shows a case in which a structure of the nano-antenna structure NA10 is modified from the device structure of FIG. 1.

Referring to FIG. 25, a nano-antenna structure NA60 having a dual patch structure may be provided on the stack structure of the first, second, third and fourth refractive index change layers R10, R20, R30, and R40 and the first, second and third QD layers A10, A20, and A30. The nano-antenna structure NA60 may include an input coupler NA61 corresponding to a first patch and an output coupler NA62 corresponding to a second patch. A resonance wavelength region of the input coupler NA61 may be at least partially overlapped with excitation wavelength regions of the quantum dots QD1, QD2, and QD3. When the light source element LS10 is used, excitation light generated from the light source element LS10 may be used, and excitation light coming from the outside may be further used altogether. The input coupler NA61 may improve input efficiency (input coupling efficiency) with respect to the excitation light (incident light) coming from the outside. The resonance wavelength region of the output coupler NA62 may be at least partially overlapped with the emission wavelength regions of the quantum dots QD1, QD2, and QD3. Accordingly, the light output characteristics (output coupling characteristics) in the first, second and third QD layers A10, A20, and A30 may be improved by the output coupler NA62.

Although FIGS. 21 to 25 illustrate a case of using the nano-antenna having a dual patch structure, a nano-antenna having a multi-patch structure having three or more patches may be used. An example thereof is illustrated in FIG. 26.

Figure 26:
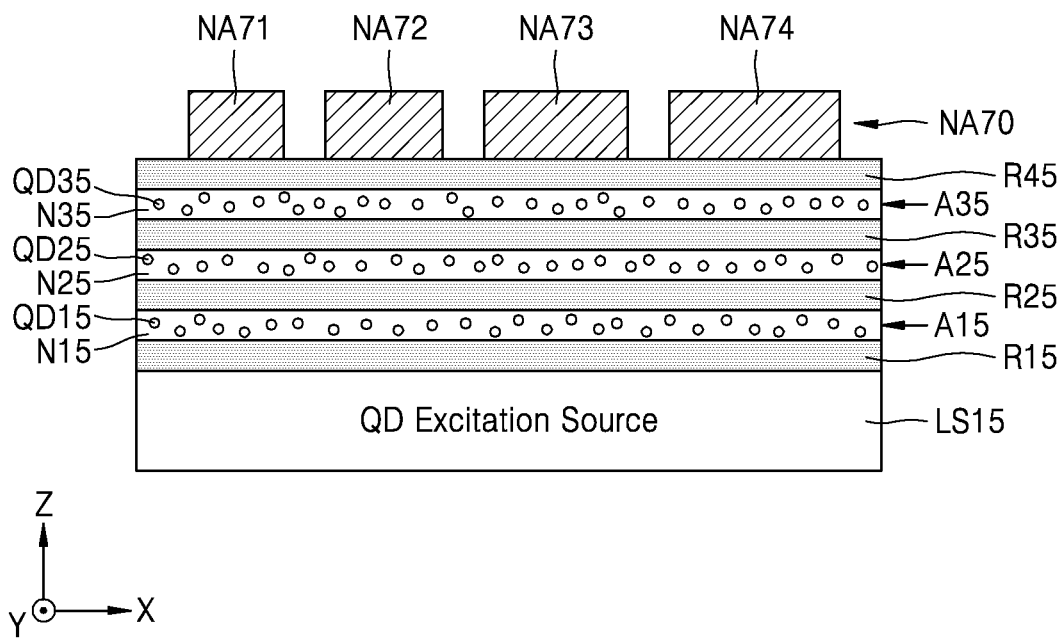
FIG. 26 is a cross-sectional view of a QD light emission device according to another embodiment.

FIG. 26 is a cross-sectional view of a QD light emission device according to another embodiment.

Referring to FIG. 26, a nano-antenna structure NA70 having a multi-patch structure may be provided on a stack structure of a plurality of refractive index change layers R15, R25, R35, and R45 and a plurality of QD layers A15, A25, and A35. For example, the nano-antenna structure NA70 may include at least one input coupler NA71 and a plurality of output couplers, that is, first, second and third output couplers NA72, NA73, and NA74. The first, second and third output couplers NA72, NA73, and NA74 may be designed to be optically coupled to different emission wavelength regions. In this regard, the first, second and third output couplers NA72, NA73, and NA74 may have different sizes, include different materials, and have different shapes. The first output coupler NA72 may correspond to an emission wavelength region of first quantum dots QD15, the second output coupler NA73 may correspond to an emission wavelength region of second quantum dots QD25, and the third output coupler NA74 may correspond to an emission wavelength region of third quantum dots QD35. Accordingly, the nano-antenna structure NA70 may be designed such that light beams emitted from the QD layers A15, A25, and A35 are output through different ones of the first, second and third output couplers NA72, NA73, and NA74. The shape, size, or arrangement order of the input coupler NA71 and the output couplers NA72, NA73, and NA74 illustrated in FIG. 26 are merely exemplary and may be changed, as necessary.

Although FIGS. 21 to 26 illustrate a case in which a nano-antenna structure has multi-patch structure, according to another embodiment, the nano-antenna structure may have other structure such as a fishbone antenna structure, which is described with reference to FIGS. 27 and 28.

Figure 27:
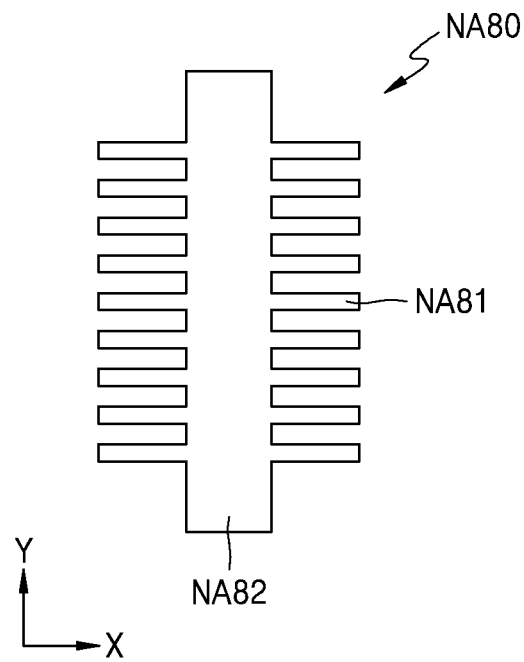
FIG. 27 illustrates a nano-antenna having a fishbone structure, which is applicable to a QD light emission device according to an embodiment.
Figure 28:
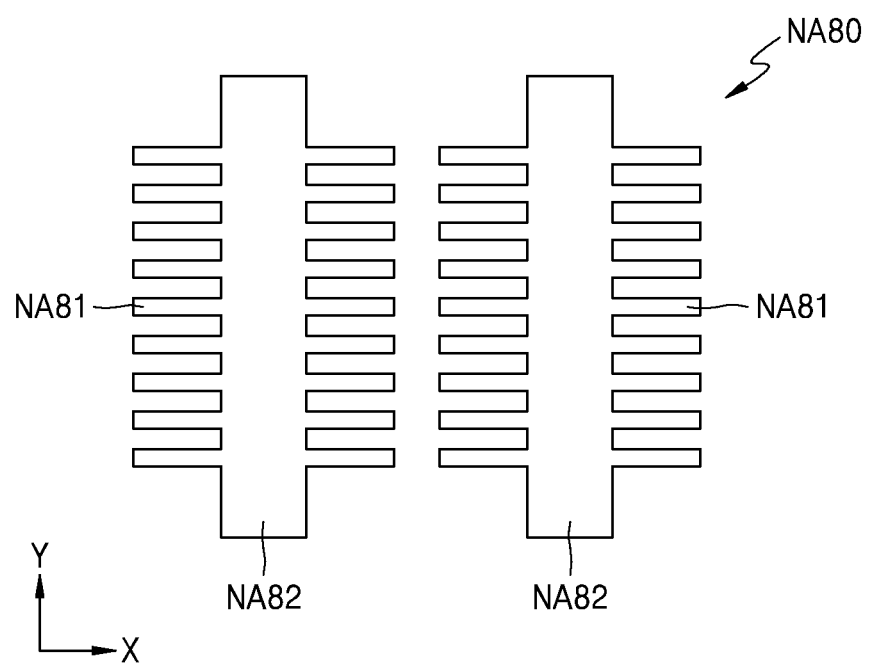
FIG. 28 illustrates a nano-antenna having a fishbone structure, which is applicable to a QD light emission device according to another embodiment.

FIGS. 27 and 28 are plan views for exemplarily explaining a nano-antenna having a fishbone structure, which is applicable to a QD light emission device according to an embodiment.

FIG. 27 illustrates a nano-antenna having a fishbone structure, which is applicable to a QD light emission device according to an embodiment.

Referring to FIG. 27, a nano-antenna structure NA80 may include a first nano-antenna element NA81 extending in a first direction and a second nano-antenna element NA82 extending in a second direction perpendicular to the first direction. In the present embodiment, the first nano-antenna element NA81 may include a plurality of first nano-antenna elements NA 71 intersecting the second nano-antenna element NA82. Accordingly, the nano-antenna structure NA80 may have a fishbone structure.

The first nano-antenna element NA81 may be an input coupler, and the second nano-antenna element NA82 may be an output coupler. In this case, incident light may have a first polarized direction by the first nano-antenna element NA81, and output light may have a second polarized direction perpendicular to the first polarized direction by the second nano-antenna element NA82. Accordingly, when the nano-antenna NA80 having a fishbone structure is used, the polarized directions of the incident light and the output light may be controlled.

FIG. 28 illustrates a nano-antenna having a fishbone structure, which is applicable to an optical modulating device according to another embodiment.

Referring to FIG. 28, the nano-antenna structure NA80 may include a plurality of nano-antenna structures NA80 which are arranged according to a certain rule. In the present embodiment, only two nano-antenna structures NA80 are exemplarily illustrated. While the two nano-antenna structures NA80 may be substantially the same, in some cases, the size, pattern size, or pattern interval thereof may vary. Furthermore, although the nano-antenna structures NA80 are arranged spaced apart from one another, the first nano-antenna elements NA81 of the nano-antenna structures NA80 may be connected to each other. The nano-antennas having a fishbone structure described with reference to FIGS. 27 and 28 are exemplary and may be variously changed.

Figure 29:
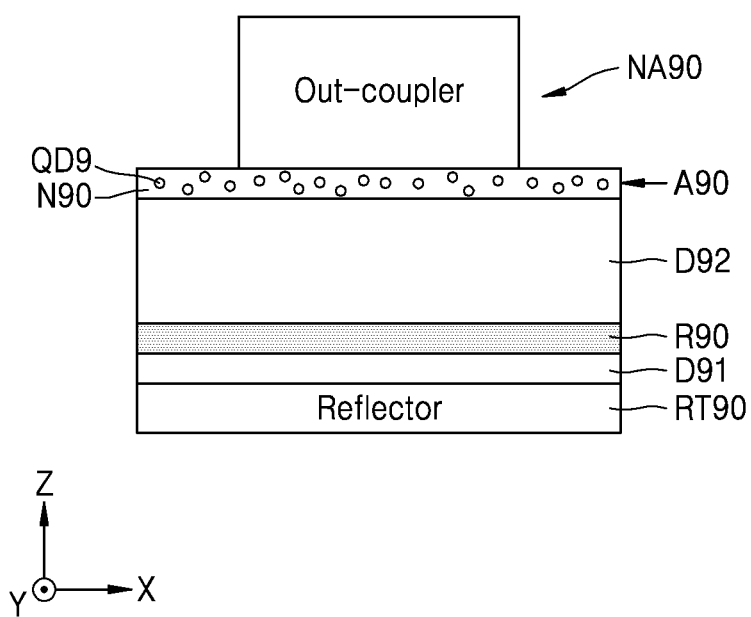
FIG. 29 is a cross-sectional view of a QD light emission device according to another embodiment.

FIG. 29 is a cross-sectional view of a QD light emission device according to another embodiment.

Referring to FIG. 29, the QD light emission device may include a QD layer A90 having a plurality of QDs having light emission characteristics. The QD layer A90 may include an insulating layer N90 and a plurality of quantum dots QD9 embedded in the insulating layer N90. A nano-antenna structure NA90 including an output coupler may be provided on the QD layer A90.

The QD light emission (light output) device of the present embodiment may further include a refractive index change layer R90 and a reflector RT90. The refractive index change layer R90 may be arranged between the QD layer A90 and the reflector RT90. Furthermore, a first dielectric layer D91 may be further provided between the reflector RT90 and the refractive index change layer R90, and a second dielectric layer D92 may be further provided between the refractive index change layer R90 and the QD layer A90.

Both of the first and second dielectric layers D91 and D92 may be transparent to light in a certain wavelength of interest region. The first and second dielectric layers D91 and D92 may provide an optical distance corresponding to an integer multiple of $\lambda/4$ between the reflector RT90 at a lower side and the QD layer A90 at an upper side. "$\lambda$" may be a central wavelength of a certain wavelength of interest (use/operation wavelength) region. By using the first and second dielectric layers D91 and D92, incident light may strongly concentrate on the QD layer A90. In this regard, the light emission device according to the present embodiment may have a Salisbury screen-type structure.

When the optical properties of the refractive index change layer R90 arranged between the first and second dielectric layers D91 and D92 are changed, the condition of an integer multiple of $\lambda/4$ is broken, and thus the intensity of light concentrating on the QD layer A90 may be controlled. In other words, when the optical properties of the refractive index change layer R90 are changed, the optical distance between the reflector RT90 and the QD layer A90 is changed, and thus the light emission characteristics of the QD layer A90 may be controlled (modulated). The optical properties of the refractive index change layer R90 may be changed in various ways. For example, by applying a certain voltage between the reflector RT90 and the nano-antenna structure NA90, an electric field is applied to the refractive index change layer R90, and thus the characteristics of the refractive index change layer R90 may be changed. Additionally, other various methods may be used therefor.

Although the nano-antenna structure NA90 is simply illustrated, it may be variously modified as described with reference to FIGS. 1 to 11 and FIGS. 19 to 28.

The nano-antenna may be an antenna having a nano structure with respect to light, which may convert light (incident light including all visible and invisible electromagnetic waves) of a specific wavelength (or frequency) to a shape of a localized surface plasmon resonance, and capture energy thereof. The nano-antenna may a conductive layer pattern, for example, a metal layer pattern, and the conductive layer pattern may be in contact with a non-conductive layer, for example, a dielectric layer. Plasmon resonance may be generated at an interface between the conductive layer pattern and the non-conductive layer, for example, a dielectric layer. An interface where surface plasmon resonance is generated, such as, the interface between the conductive layer pattern and the non-conductive layer, for example, a dielectric layer, may be collectively referred to as a "meta surface" or a "meta structure". The nano-antenna may be formed of a conductive material and may have a dimension of a sub-wavelength. The sub-wavelength may mean a dimension less than the operation wavelength of the nano-antenna. At least any one of dimensions forming a shape of the nano-antenna, for example, a thickness, a horizontal length, a vertical length, or an interval between nano-antennas, may have the dimension of a sub-wavelength.

The nano-antenna may have a variety of structures/shapes such as a rectangular pattern, a line pattern, a circular disc, an oval disc, a cross, or an asterisk. A cross type may have a shape in which two nanorods intersect perpendicular to each other. An asterisk type may have a star shape in which three nanorods intersect with one another. In addition, the nano-antenna may have a variety of modified structures such as a cone, a triangular pyramid, a sphere, a hemisphere, a rice grain, or a rod. Furthermore, the nano-antenna may have a multilayer structure in which a plurality of layers are stacked, or a core-shell structure including a core part and at least one shell part. Additionally, two or more nano-antennas having different structures/shapes forming one unit may be cyclically arranged.

A resonance wavelength, a resonant wavelength width, resonant polarization characteristics, a resonance angle, reflection/absorption/transmission characteristics may be changed depending on the structure/shape and arrangement method of the nano-antenna. Accordingly, by controlling the structure/shape and arrangement method of the nano-antenna, an optical modulating device having characteristics suitable for a purpose may be manufactured.

The QD light emission devices according to various embodiments may be applied to a variety of optical apparatuses such as a thin display, an ultrathin display, an on-chip emitter for an integrated optical circuit, a light fidelity (Li-Fi) field corresponding to a next generation wireless fidelity (Wi-Fi), or a light detection and ranging (LiDAR) apparatus. Furthermore, the QD light emission device according to the above-described embodiments may be applied to a holographic display apparatus and a structured light generation apparatus. Furthermore, the QD light emission device may be applied to a variety of optical element/apparatus such as a hologram generation apparatus or an optical coupling device. Furthermore, the QD light emission device may be applied to a variety of fields in which a "meta surface" or a "meta structure" is used. In addition, the QD light emission device according to the above-described embodiment and the optical apparatus including the same may be applied to a variety of optical and electronic apparatus fields for various purposes.

Additionally, although, in the above-described embodiments, application (biasing) of an electrical signal, that is, a voltage, is mainly described for modulating a refractive index of the refractive index change layer, there may be a variety of methods of modulating the refractive index of the refractive index change layer. For example, modulating method of the refractive index of the refractive index change layer may include electric field application, magnetic field application, heating and cooling, optical pumping, or microscale or nanoscale electro-mechanical deformation and modulation. Furthermore, a material and a configuration/structure of the refractive index change layer may be changed in various ways.

It should be understood that embodiments described herein should be considered in a descriptive sense only and not for purposes of limitation. Descriptions of features or aspects within each embodiment should typically be considered as available for other similar features or aspects in other embodiments. For example, one of ordinary skill in the art to which the present disclosure pertains would understand that the structure of the optical modulating device described with reference to FIGS. 1 to 11 and FIGS. 19 to 29 may be changed in various ways.

While one or more embodiments have been described with reference to the figures, it will be understood by those of ordinary skill in the art that various changes in form and details may be made therein without departing from the spirit and scope as defined by the following claims.

What is claimed is:

1. A quantum dot (QD) light emission device comprising:
a layered structure comprising a QD layer, the QD layer comprising a plurality of QDs having light emission characteristics; and
a nano-antenna structure comprising an output coupler configured to control an output characteristic of light emitted from the QD layer,
wherein the layered structure has a stack structure comprising:
a plurality of QD layers, and
a plurality of refractive index change layers,
wherein the plurality of QD layers are arranged between the plurality of refractive index change layers.

2. The QD light emission device of claim 1, wherein the output coupler is further configured to output an emission wavelength of the QD layer.

3. The QD light emission device of claim 1, wherein a resonance wavelength region of the output coupler is at least partially overlapped with an emission wavelength region of the QD layer.

4. The QD light emission device of claim 1, wherein the output coupler comprises one of a metallic antenna, a dielectric antenna, and a slit-containing structure.

5. The QD light emission device of claim 1, wherein the output coupler comprises a refractive index change material or a phase change material, and
wherein the output characteristic of light is controlled based on a refractive index change or a phase change of the output coupler.

6. The QD light emission device of claim 1, wherein the nano-antenna structure further comprises an input coupler spaced apart from the output coupler.

7. The QD light emission device of claim 6, wherein a resonance wavelength region of the input coupler is at least partially overlapped with an excitation wavelength region of the plurality of QDs.

8. The QD light emission device of claim 1, wherein the nano-antenna structure has a multi-patch antenna structure or a fishbone antenna structure.

9. The QD light emission device of claim 1, wherein input light to the light emission device has a first polarized direction, and output light from the light emission device has a second polarized direction perpendicular to the first polarized direction.

10. The QD light emission device of claim 1, wherein the output coupler comprises a plurality of output couplers, and
wherein a first output coupler, among the plurality of output couplers, has a size different from a second output coupler, among the plurality of output couplers.

11. The QD light emission device of claim 1, wherein the layered structure further comprises a refractive index change layer provided adjacent to the QD layer, and
wherein a light emission characteristic of the QD layer is modulated based on a change in a refractive index of the refractive index change layer.

12. The QD light emission device of claim 11, wherein the layered structure has a stack structure comprising:
a plurality of QD layers and
a plurality of refractive index change layers,
wherein the plurality of QD layers are arranged between the plurality of refractive index change layers.

13. The QD light emission device of claim 12, wherein at least two of the plurality of QD layers have different central emission wavelengths.

14. The QD light emission device of claim 12, wherein at least two of the plurality of refractive index change layers are made of different materials or have different carrier densities.

15. The QD light emission device of claim 12, further comprising: one of a light source element configured to optically excite QDs of the plurality of QD layers and an optical waveguide configured to guide light to optically excite the QDs of the plurality of QD layers.

16. The QD light emission device of claim 12, further comprising:
a reflector provided at a first surface of the stack structure; and
a band-stop mirror provided at a second surface of the stack structure.

17. The QD light emission device of claim 16, further comprising one of a light source element configured to optically excite QDs of the plurality of QD layers or an optical waveguide configured to guide light to optically excite the QDs, wherein the one of the light source element and the optical waveguide are provided between the stack structure and the reflector.

18. The QD light emission device of claim 1, wherein the layered structure further comprises a reflector and a refractive index change layer, wherein the refractive index change layer is arranged between the reflector and the QD layer, and wherein the QD layer is arranged between the refractive index change layer and the nano-antenna structure.

19. The QD light emission device of claim 18, further comprising:

a first dielectric layer arranged between the reflector and the refractive index change layer; and a second dielectric layer arranged between the refractive index change layer and the QD layer.

20. An optical apparatus comprising the QD light emission device of claim 1.

21. A quantum dot (QD) light emission device comprising:

a multilayer structure comprising a QD layer and a refractive index change layer adjacent to the QD layer, the QD layer comprising a plurality of QDs having light emission characteristics; and an output coupler arranged on a surface of the multilayer structure and configured to control an output characteristic of light emitted from the QD layer, wherein the light emission characteristic of the QD layer is modulated based on a change in a refractive index of the refractive index change layer, and wherein the output coupler is further configured to output at an emission wavelength of the QD layer.

22. The QD light emission device of claim 21, wherein the output coupler comprises one of a metallic antenna, a dielectric antenna, and a slit-containing structure.

23. The QD light emission device of claim 21, further comprising an input coupler provided on the surface of the multilayer structure and spaced apart from the output coupler.

24. The QD light emission device of claim 23, wherein the output coupler and the input coupler have a multi-patch antenna structure or a fishbone antenna structure.

25. The QD light emission device of claim 21, wherein the multilayer structure comprises:

a plurality of QD layers and a plurality of refractive index change layers, wherein the plurality of QD layers are arranged between the plurality of refractive index change layers, and wherein at least two of the plurality of QD layers have different central emission wavelengths, or at least two of the plurality of refractive index change layers are made of different materials or have different carrier densities.

26. The QD light emission device of claim 21, wherein the multilayer structure further comprises a reflector, wherein the refractive index change layer is arranged between the reflector and the QD layer, and the QD layer is arranged between the refractive index change layer and the output coupler.

27. The QD light emission device of claim 26, further comprising:

a first dielectric layer arranged between the reflector and the refractive index change layer; and a second dielectric layer arranged between the refractive index change layer and the QD layer.

28. An optical apparatus comprising the QD light emission device of claim 21.

* * * * *